United States Patent [19]

Zoroglu et al.

[11] 3,737,985

[45] June 12, 1973

[54] METHOD OF PRODUCING THIN LAYERS ON A SUPPORT

[75] Inventors: Demir S. Zoroglu; William L. George, both of Scottsdale, Ariz.

[73] Assignee: Motorola, Inc., Franklin Park, Ill.

[22] Filed: Oct. 16, 1970

[21] Appl. No.: 81,333

[52] U.S. Cl. .................... 29/578, 29/569 L, 29/580

[51] Int. Cl. .................... B01j 17/00

[58] Field of Search .................... 29/569 L, 576, 578, 29/580; 317/235 N; 313/108 D

[56] References Cited

UNITED STATES PATENTS

| | | | |
|---|---|---|---|
| 3,349,476 | 10/1967 | Pilkuhn et al. | 29/576 L |
| 3,590,479 | 7/1971 | DeVries | 29/580 |
| 3,501,679 | 3/1970 | Yonezu et al. | 317/235 |
| 3,518,418 | 6/1970 | Dubois | 313/108 D |
| 3,330,991 | 7/1967 | Lavine et al. | 317/235 |

*Primary Examiner*—Charles W. Lanham
*Assistant Examiner*—W. C. Tupman
*Attorney*—Mueller & Aichele

[57] ABSTRACT

While it is possible to diffuse P impurities into compounds of gallium and arsenic that are useful in producing light emitting PN junctions, at the present state of the art it is not possible to diffuse N type impurities thereinto whereby at the present state of the art thin layers of N type material of gallium and arsenic compounds cannot readily be obtained. The light produced by the PN junction in a light emitting diode is much more greatly absorbed by the P layer than by the N layer, whereby it is advantageous to produce a very thin N type layer in the production of the light emitting PN junctions. A method is disclosed for providing a very thin layer of N type material, the material being a compound of gallium and arsenic that may or may not include other elements that is useful in light emitting diodes.

3 Claims, 2 Drawing Figures

Figure 1:
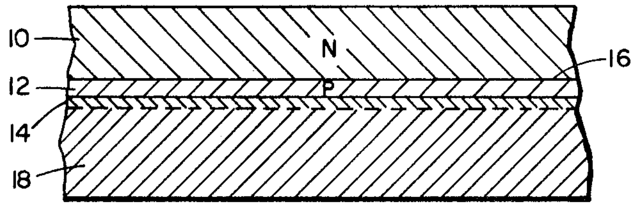

INVENTOR.
William L. George
BY Demir S. Zoroglu
Mueller & Aichele
ATTY'S.

METHOD OF PRODUCING THIN LAYERS ON A SUPPORT

BACKGROUND

Light emitting diodes are known in which a PN junction is produced in a compound of gallium and arsenic which may or may not include other elements such as phosphorus. Hereinafter, such compounds will be called gallium arsenic compounds. While the material of gallium arsenic compounds which are highly doped with N material can be made, at the present state of the art N impurities cannot be diffused into such compounds, while P material can be diffused into such compounds. Therefore, while the P layer comprising the PN junction can be made as thin as desired by using known diffusion steps, it is impossible to make a thin N layer by this method. The light produced by a light emitting diode is so produced that it could propagate in all directions. However, the P type gallium arsenic compounds absorb light many times as greatly as the N type gallium arsenic compounds. Therefore, it is advantageous, in getting as much light out of a light emitting PN junction as possible, to make the N layer very thin and to use the P layer as a backing. Furthermore, when produced, the N type gallium arsenic compounds may be highly conductive whereby they are more highly conductive than the P type gallium arsenic compounds which are produced by diffusion, whereby a small electrode on the N layer will present much less spreading resistance to current flow than an electrode of the same size on the P layer. Since electrodes must be applied to these layers to provide energization for the light emitting diode, it is advantageous to use the N layer as the layer through which the light is propagated and to which a small electrode is applied, since a smaller portion thereof needs to be covered by the electrode (which may be opaque or not fully transparent to the light produced by the PN junction,) than if the light were propagated out of the P layer.

It is an object of this invention to provide a method for producing a very thin layer of a semiconductor.

It is an object of this invention to provide a method of producing an improved light emitting diode.

It is a still further object of this invention to provide a method for producing a light emitting diode in which the N layer is very thin.

SUMMARY

In accordance with this invention, P type impurities are diffused into the surface of a block of highly doped N type gallium arsenic compound which is useful in producing light emitting devices. The diffusion of P impurities may be into the whole surface of the block, or by using masking techniques, only through a selected portion of the area. Then a conductor material is deposited on the surface into which the P impurities are diffused and additional conductor material is electroplated to a required thickness, the thickness being great enough so that the layer which may be called the backing layer, produced by the electro-deposition will act as a support for the finished article. Then the N portion of the block is thinned down by any known manner such as by grinding and lapping or by etching or by electrolytic removal until the N layer is as thin as is desired. To complete the PN junction, an electrode may be deposited on the N surface, the electro-plated backing being the other electrode.

DESCRIPTION

Figure 2:
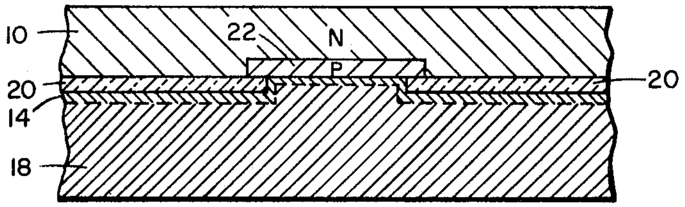

The invention will be better understood upon reading the following description in connection with the accompanying drawing in which FIGS. 1 and 2 illustrate the method of this invention.

Turning first to FIG. 1, a block or thick layer 10 of N doped semiconductor material that is useful in producing light emitting devices is provided. As is known, this material includes compounds of gallium with arsenic with or without other elements such as phosphorus. As is also known, it is not possible at this state of the art to diffuse N type impurities into such compounds. This N type block is produced in a relatively thick form and is self supporting. A thin layer 12 of P material is diffused into the surface, the lower one as viewed in FIG. 1, of FIG. 1. Then, a very thin layer 14 of metal is placed on the P type layer 12 as by metal evaporation or by flame spraying or by any other known method. This metal may be chosen to act as a reflector for the light that will be produced at the PN junction 16 between the N layer 10 and the P layer 12, when the PN junction 16 is biased to produce light. Then a thick enough layer 18 of an appropriate metal such as gold or silver is built up on the evaporated layer 14 so that the layers 14 and 18 have strength enough to support the finished product. Then, by any known method, such as by lapping or by etching or by electrolysis or a combination of these methods, the N layer 10 is made of the desired thickness such as 1 mil or less. Since the N material of the layer 10 is highly conductive, a small electrode not shown may be applied to the thin layer 10 while the conductive backing layer 18 may be the other electrode for the light emitting device thereby produced. It is desirable to have a small electrode applied to the N layer 10 since the produced light comes out through this layer and therefore only a very small portion thereof should be blocked off by an electrode. The large electrode 18 on the P layer 12 is desirable since the large electrode provides a large area of contact to the higher resistivity P material layer 12 and since the large electrode 18 may act as a reflector.

A variation of the method illustrated by FIG. 1 is illustrated in FIG. 2. In FIGS. 1 and 2, the same reference characters are provided for the same elements. FIG. 2 differs from FIG. 1 only in that an oxide layer 20 is placed on the lower face (as viewed in FIG. 2) of the N substrate 10 and a pattern is etched through the oxide layer 20 before P material is diffused into the substrate 10 to produce the P region 22, all in a known manner. The steps of putting on the evaporated or sputtered metal layer 14 and then the plated backing layer 18 follow, and then the layer 10 is thinned down, all as is noted above in connection with FIG. 1.

While the method of providing thin semiconductor layers is shown and described in connection with the production of a light emitting device including a PN junction, this method may be used wherever desired. For example, when a current passes through a semiconductor in its use, heat is produced in the semiconductor and in any PN junction therein. The above described method may be used to apply a heat sink to the semiconductor as close as may be desired to the PN junction thereof to keep the operating temperature of the semiconductor device at a safe operating level.

We claim:

1. A method of producing a light emitting diode in a relatively thick N-type body of semiconductor material having an oxide layer thereon, said oxide layer having an aperture exposing a portion of said N-type body comprising the steps of:

a. diffusing a P-type impurity into said N-type body through said aperture, thereby forming a PN junction and a relatively thin P-type layer within said N-type body and approximately co-extensive with said aperture;

b. forming a thin first metal layer on said oxide layer and contacting said P-type layer through said aperture, thereby providing a reflective surface for light emitted at said PN junction and transmitted through said P-type layer;

c. forming a relatively thick second metal layer on an exposed surface of said first metal layer thereby, providing a support member for said light emitting diode and providing uniform electrical contact to said P-type layer and also providing low thermal resistance to said PN junction;

d. reducing the thickness of said N-type region, thereby reducing the length of the paths both for light emitted at said PN junction and traveling to the exposed surface of said N-type region and transmitted therethrough, and also for light reflected within said light emitting diode between said metal reflective surface and said exposed surface of said N-type region;

e. providing an electrode contacting said N-type body and permitting efficient transmission of light from said light emitting diode.

2. The method as recited in claim 1 wherein said semiconductor material is a gallium arsenide.

3. The method as recited in claim 1 wherein the thickness of said N-type region is reduced to less than one mil.

* * * * *